(12) United States Patent
Huang et al.

(10) Patent No.: US 6,825,050 B2
(45) Date of Patent: Nov. 30, 2004

(54) INTEGRATED STEPWISE STATISTICAL PROCESS CONTROL IN A PLASMA PROCESSING SYSTEM

(75) Inventors: Chung-Ho Huang, Fremont, CA (US); John A. Jensen, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/165,511

(22) Filed: Jun. 7, 2002

(65) Prior Publication Data

US 2003/0226821 A1 Dec. 11, 2003

(51) Int. Cl.[7] .......................... H01L 21/00; H05H 1/00; C23C 16/00
(52) U.S. Cl. ...................... 438/5; 438/689; 156/345.24; 118/712
(58) Field of Search ............................... 438/9, 710, 5, 438/689; 156/345.24, 345.26, 345.27, 345.28; 118/712

(56) References Cited

U.S. PATENT DOCUMENTS

| | | |
|---|---|---|
| 5,479,340 A | 12/1995 | Fox et al. |
| 5,576,629 A | 11/1996 | Turner et al. |
| 5,859,964 A | 1/1999 | Wang et al. |
| 5,971,591 A * | 10/1999 | Vona et al. .................. 700/220 |
| 6,481,369 B1 * | 11/2002 | Takahashi et al. ..... 118/723 EB |

FOREIGN PATENT DOCUMENTS

| EP | 1 089146 A2 | 4/2001 |
|---|---|---|
| WO | WO 00/03421 | 1/2000 |

OTHER PUBLICATIONS

Guo et al., "A Real–Time Equipment Monitoring and Fault Detection System", (Taiwan) Nat'l Taiwan Univ., Dept. of Ind. Mgmt. & Bus. Admin., pp. 111–23.
Spanos, et al., "Real–Time Statistical Process Control Using Tool Data", (11/92) IEEE Trans. On Semicond. Mfg, vol. 5, No. 4, pp. 308–318.
Bunkofske, et al., "Real–Time Process Monitoring", (1996) IEEE/SEMI, Adv. Semicond. Mfg. Conf., pp. 382–390.
PCT International Search Report, PCT/US03/14474, mailed Sept. 1, 2003.

* cited by examiner

*Primary Examiner*—Parviz Hassanzadeh
(74) *Attorney, Agent, or Firm*—IP Strategy Group PC

(57) ABSTRACT

An automated process control system configured for controlling a plasma processing system having a chamber, the chamber being configured for processing a substrate. The automatic process control system includes a first sensor disposed within the chamber, the first sensor being configured for making a first plurality of measurements pertaining to a first parameter associated with a structure disposed at least partially within the chamber. The performing the first plurality of measurements is performed during the processing of the substrate. The automatic process control system further includes first logic coupled to receive the first plurality of measurements from the first sensor. The first logic is configured for analyzing using SPC methodologies the first plurality of measurements during the processing. There is also included second logic coupled to receive a first signal from the first logic, the second logic being configured to stop the processing prior to completing the processing if the first signal indicates a fault with the processing.

20 Claims, 8 Drawing Sheets

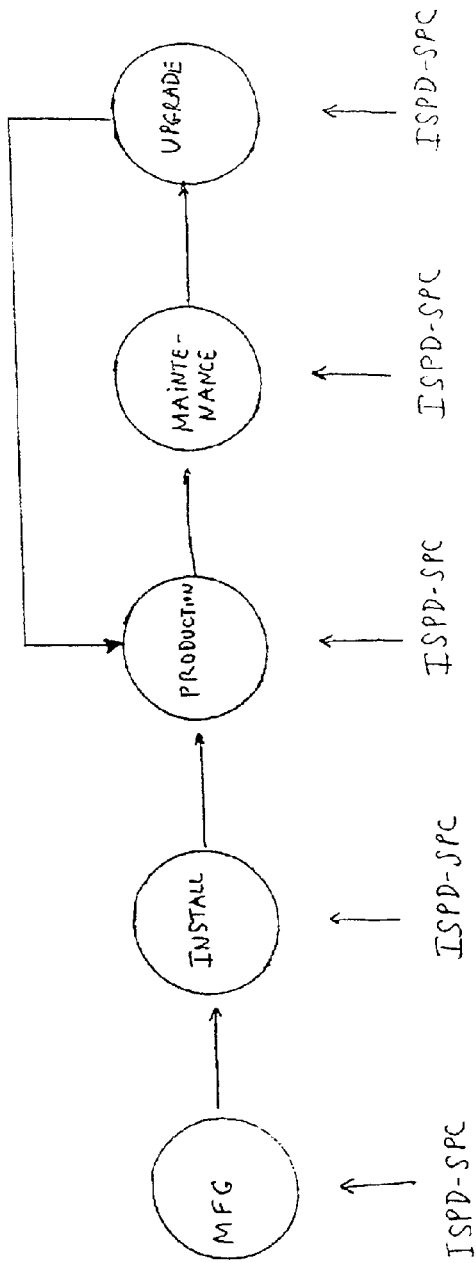

| Step | 1 | 2 | 3 | 4 | 5 | 6 |
|---|---|---|---|---|---|---|
| Description | (Strike) | BARC | HARC | BARC | Trench | He Only |
| WAP (mT) | 120 | 60 | 45 | 100 | 150 | 1 |
| RF 2MHz (W) | 0 | 0 | 0 | 0 | 0 | 0 |
| RF 27MHz (W) | 0 | 0 | 0 | 0 | 0 | 0 |
| Ar | 150 | 100 | 100 | 0 | 500 | 0 |
| O2 (small) | 10 | 8 | 10 | 7 | 10 | 0 |
| O2 (large) | 50 | 60 | 0 | 350 | 0 | 0 |
| C4F8 | 0 | 0 | 15 | 0 | 0 | 0 |
| He (Torr) | 0 | 0 | 0 | 0 | 0 | 0 |
| Completion | time | time | time | time | time | time |
| Time | 20 | 30 | 30 | 30 | 30 | 20 |
| Conf Ring Preset | 0* | 0 | 0 | 0 | 0 | 0 |
| WAP Hold Delay | 2 | 0 | 0 | 0 | 0 | 0 |
| WAP Control Mode | Pressure | Pressure | Pressure | Pressure | Pressure | Transfer |
| Nominal Conf Ring Pos | 630-670 | 610-650 | 600-640 | 610-650 | 610-650 | |

Fig. 4A

| Step | 1 | 2 |
|---|---|---|
| Description | chuck | dechuck |
| WAP (mT) | 1 | 1 |
| RF 2MHz (W) | 0 | 0 |
| RF 27MHz (W) | 0 | 0 |
| Ar | 0 | 0 |
| O2 | 0 | 0 |
| C4F8 | 0 | 0 |
| He (Torr) | 20 | 5 |
| Completion | time | time |
| Time | 20 | 10 |
| WAP Control Mode | Transfer | Transfer |
| Nonimal He Flow (sccm) | <5 | >3 |
| Nonimal He Pressure (Torr) | 20 | 5 |

INTEGRATED STEPWISE STATISTICAL PROCESS CONTROL IN A PLASMA PROCESSING SYSTEM

The present invention relates to apparatus and methods for improving efficiency in the manufacture of integrated circuitry on a substrate, such as a semiconductor substrate for use in IC fabrication or a glass panel for use in flat panel display fabrication. More particularly, the present invention relates to apparatus and methods for integrating stepwise statistical processing functionalities into a plasma processing system environment to render the process of manufacturing, installing, qualifying, operating, maintaining and/or upgrading the plasma processing system more efficient.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels. During processing, multiple deposition and/or etching steps are typically employed. During deposition, materials are deposited onto a substrate surface (such as the surface of a glass panel or a wafer). For example, deposited layers comprising various forms of silicon, silicon dioxide, silicon nitride, metals and the like may be formed on the surface of the substrate. Conversely, etching may be employed to selectively remove material from predefined areas on the substrate surface. For example, etched features such as vias, contacts, or trenches may be formed in the layers of the substrate. In both deposition and etching applications, multiple steps may be performed to achieve the proper deposition of materials and/or the acceptable etching of features through one or more layers.

As integrated circuits become more complex and their operating speeds increase, circuit designers are packing an ever increasing number of devices (such as transistors, resistors, capacitors, and the like) into a smaller area on the substrate. Furthermore, in order to achieve even higher speeds, circuit designers frequently resort to exotic and expensive materials to deposit and/or to etch the layers that form the resultant ICs. To accommodate these requirements, plasma processing systems are also becoming highly complex and expensive to manufacture and to operate.

In the semiconductor industry, the cost of ownership of a given plasma processing system is a critical issue for plasma processing equipment vendors and IC manufacturers alike. In a very simplistic sense, the cost of ownership of a given plasma processing system can viewed as the cost, in terms of time, effort, and money spent, to acquire and operate that plasma processing system per unit of production, e.g., per substrate successfully processed.

For equipment vendors, one way to reduce the cost of ownership is reduce the amount of time and effort associated with manufacturing, installing, and qualifying a plasma processing system for production use. For example, an equipment vendor would strive to minimize the time and effort required to produce a plasma processing system that satisfies a particular set of system specifications. During the installation process, an equipment vendor would also try to minimize the time and effort involved in assembling the various parts of the manufactured plasma processing system into a working unit at a customer site. During the qualification process, an equipment vendor would strive to minimize the time and effort required to ensure that an installed plasma processing system can satisfactorily perform a particular process required by the customer/IC manufacturer. By reducing the amount of time and effort required to manufacture, install, and qualify a plasma processing system for production use, equipment vendors can reduce the system acquisition cost and may be able to pass some or all of the savings to their customers (i.e., the IC manufacturers who purchase the plasma processing systems for use in producing ICs), thereby lowering the cost of ownership of that plasma processing system.

After a given plasma processing system is put into production use, one way to further reduce the cost of ownership of that plasma processing system is to increase yield, i.e., increasing the number of successfully processed substrates per any given time period. Under this approach, the cost of acquiring the plasma processing system is viewed as a sunk cost, and if that plasma processing system can be optimized to produce a greater number of commercially acceptable processed substrates per unit of time, the effective cost to produce each commercially acceptable processed substrate is lowered.

Yet another way to further reduce the cost of ownership is to increase the utilization of the plasma processing system, e.g., by minimizing the amount of time that the system is taken out of production for maintenance and/or upgrade so that the system could be employed for production for a larger percentage of the time. Maintenance is a big issue since the process involved in, for example, cleaning a plasma processing chamber, in diagnosing and replacing broken parts, and in requalifying a system after maintenance for subsequent production use is very time consuming. In one sense, some maintenance is unavoidable to keep the plasma processing system in good working order and to minimize the number of IC defects. However, unnecessary maintenance needlessly reduces the amount of time that a given system can be employed for production. Worse, incorrect maintenance procedures and/or intervals on certain subsystems can lead to severe damage to the plasma processing system and/or destroy many expensive substrates.

In metrology, equipment vendors and IC manufacturers alike examine the processed substrates for evidence of unacceptable defects, and to employ the information obtained from such examination as feedback in the manufacture, installation, qualification, operation, and upgrade processes. For example, one or more substrates may be processed as part of the system manufacturing process to allow an equipment vendor to examine the processed substrates and to determine whether the manufactured plasma processing system conforms to predefined system specifications. As a further example, after the various parts of the manufactured plasma processing system are shipped to a customer site and reassembled, one or more substrates may be processed therein, and the processed substrates may be examined to determine whether the plasma processing system has been correctly reassembled at the customer site. As yet another example, during the qualification cycle for a particular process recipe, one or more substrates may be processed to allow a process engineer to determine whether the plasma processing system can satisfactorily perform a process required by the customer. If the substrates show an unacceptable level of defect, specialists may be called upon to troubleshoot the plasma processing system, and the cycles of processing substrates, examining the processed substrates, and troubleshooting the plasma processing system based on the data obtained from the processed substrates may continue until the plasma processing system is brought into specification and is deemed satisfactory for production use.

While the processed substrates can furnish certain data useful in the manufacture, installation, and qualification of a plasma processing system, there are disadvantages associated with relying primarily on substrates data to guide the manufacturing, installation, and qualification processes. For example, if a process involves multiple steps, each with its own gas mixture, gas pressure, RF voltage and power settings, and duration, it is difficult to ascertain exactly, by examining a post-process substrate, which parameter in which step did not conform to specifications and is thus likely to be the source of the defects. In metrology, one can refer back to the log file to obtain more information but the process is not integrated and requires one or more wafer runs (and possibly ruining one or more wafers) before the problem is spotted.

Furthermore, the whole cycle of processing a substrate, examining the processed substrate, and troubleshooting the plasma processing system based on the data obtained from the processed substrates may take a substantial amount of time. If multiple cycles are required to remedy a manufacturing, installation, or qualification problem, the multiple cycle times increase the total time and effort required to bring a plasma processing system on line for production, thereby contributing to a higher cost of ownership even before a single production IC is created.

Once a plasma processing system is placed into production, the processed substrates outputted by the plasma processing system are periodically examined to obtain information about system performance. While equipment manufacturers try to create a maintenance schedule that cleans and/or replaces parts before problems arise, equipment failure would still occur sometimes. Since raw substrates, processed gases, and plasma processing systems are all expensive, IC manufacturers are motivated to detect failures as quickly as possible to minimize further damage to substrates and/or other subsystems of the plasma processing system and to remedy the failure found to bring the plasma processing system back on line quickly.

In the typical case, once it is ascertained that the processed substrate contains an unacceptably high number of defects, a specialist may be called upon to troubleshoot the plasma processing system. An experienced specialist may be able to guess fairly accurately, based on his/her experience and the data obtained from the defective substrates, the possible sources of the defect and to perform the appropriate maintenance steps to address those possible sources of defect. Once the maintenance steps are performed, one or more substrates may be processed, and the output substrates may be examined again to determine whether the defects have been remedied. If they persist, other maintenance steps may be performed and other substrates may be processed to again ascertain whether the defects have been remedied. The cycles of performing one or more maintenance steps and examining the output substrates for defects may continue until the defects are remedied.

Occasionally, the IC manufacturer and/or the system vendor may wish to upgrade the hardware and/or software of a plasma processing system to address a problem or to improve the system's capabilities. Once new hardware and/or software is installed, it is not unusual to run one or more batches of substrates through the newly upgraded plasma processing system and to examine the processed substrates to ensure that the upgraded plasma processing system performs as designed.

Again, while the processed substrates can furnish certain data useful in monitoring the production of ICs in installed and/or upgraded plasma processing systems, there are disadvantages associated with relying primarily on substrates data to guide the operation and/or maintenance of the plasma processing system. As discussed in the earlier example, if a process involves multiple steps, each with its own gas mixture, gas pressures, RF voltages and power settings, and duration, it is difficult to ascertain exactly, by examining a post-process substrate, which parameter in which step did not conform to specifications and is thus likely to be the source of the defects. Furthermore, the whole cycle of processing a substrate, examining the processed substrate, and troubleshooting the plasma processing system based on the data obtained from the processed substrates may take a substantial amount of time. If multiple cycles are required, the multiple cycle times increase the total time and effort required to remedy the failure and to bring the plasma processing system back on line for production use, thereby contributing to a higher average cost per substrate successfully processed.

In view of the foregoing, there are desired improved apparatus and methods for improving efficiency in the process of manufacturing, installing, qualifying, operating, maintaining and/or upgrading the plasma processing system.

SUMMARY OF THE INVENTION

The invention relates, in one embodiment, to a method for controlling a plasma processing system having a chamber, the chamber being configured for processing a substrate. The method includes providing a first sensor within the chamber, the first sensor being configured for monitoring a first parameter within the chamber during the processing and for outputting first data. The method further includes providing logic for analyzing the first data obtained from the sensor, the analyzing being performed during the processing. If the first data indicates a fault with the processing, the method includes outputting a first signal responsive to the analyzing.

In another embodiment, the invention relates to an automated process control system configured for controlling a plasma processing system having a chamber, the chamber being configured for processing a substrate. The automatic process control system includes a first sensor disposed within the chamber, the first sensor being configured for making a first plurality of measurements pertaining to a first parameter associated with a structure disposed at least partially within the chamber. The performing the first plurality of measurements is performed during the processing of the substrate. The automatic process control system further includes first logic coupled to receive the first plurality of measurements from the first sensor. The first logic is configured for analyzing the first plurality of measurements during the processing. There is also included second logic coupled to receive a first signal from the first logic, the second logic being configured to stop the processing prior to completing the processing if the first signal indicates a fault with the processing.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A is a simplified diagram showing, in accordance with one aspect of the present invention, the integrated stepwise application of SPC to various steps during the manufacturing, installation, qualification, operation, maintenance, and upgrade processes.

FIGS. 4A–4C show three different matrices showing three exemplary test recipes furnished for IS-SPC use, along with the expected values.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
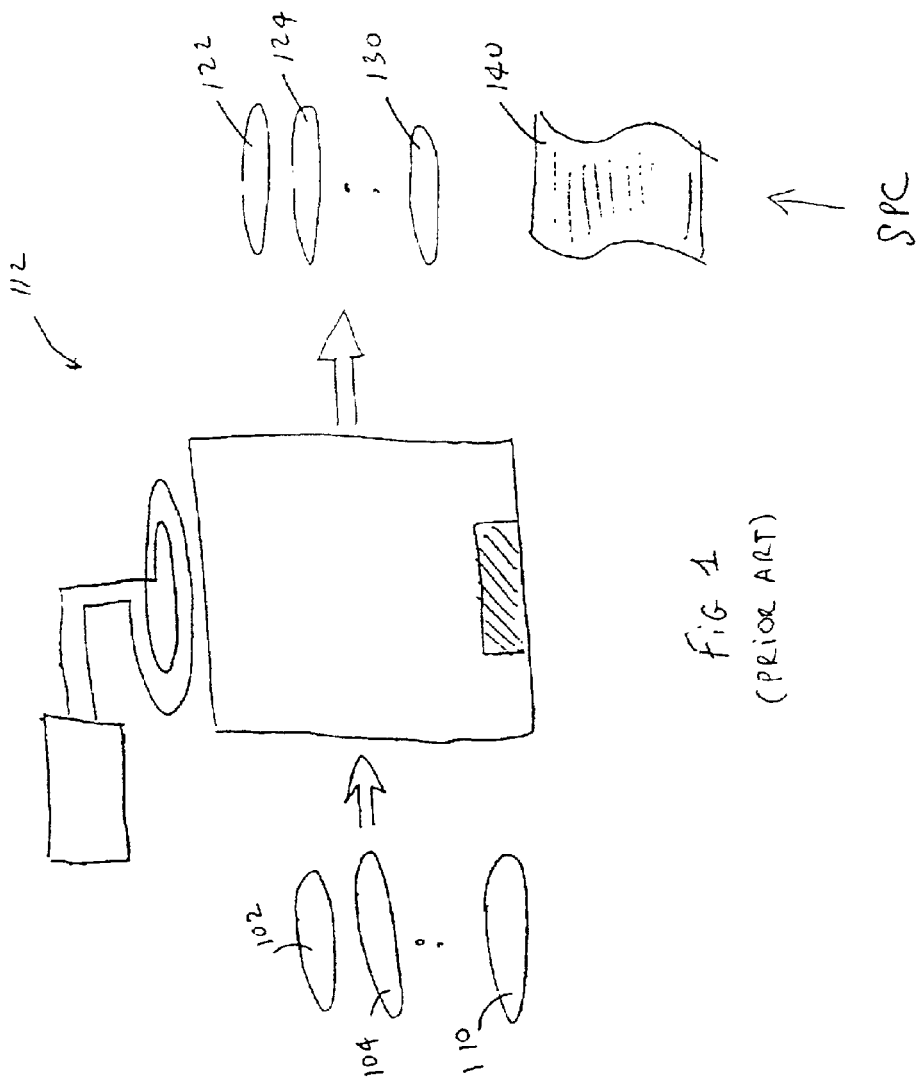
FIG. 1 is a prior art diagram depicting how statistical process control (SPC) is employed in the prior art.

To facilitate discussion of the advantages of the present invention, FIG. 1 is a prior art diagram depicting how statistical process control (SPC) is employed in the prior art. Generally speaking, SPC is applied in the prior art to the post-production substrates and the data log file that accompanies the post-production substrates. With reference to FIG. 1, there are shown substrates 102, 104, and 110, representing a plurality of substrates in a lot. Substrates 102, 104, and 110 are typically production wafers to be processed in a plasma processing system 112 to produce processed substrates 122, 124, and 130. The processed substrates 122, 124, and 130 are subsequently employed to create the finished IC or flat panel products. A data log file 140 is produced as part of the substrate processing.

In the typical prior art case, SPC is applied to the data log file 140 that is output after each lot of substrates (which may have 10, 20, or 50 substrates) is processed. In certain cutting edge prior art systems, SPC may be performed even on a substrate-by-substrate basis as the processing of each substrate through plasma processing system 112 is finished. By examining the post-production substrates, it is possible to ascertain whether the processed substrate contains an unacceptable number of defects. If an unacceptable number of defects is detected, the post-production data log file may be examined to better understand the cause of the defects.

As mentioned, in the ideal case, an experienced specialist can fairly quickly narrow down the cause of the defects and can apply the appropriate corrective actions, such as the appropriate maintenance steps or the replacement of certain subsystems. Once the corrective actions are taken, new production substrates are processed and the processed substrates as well as their data log files are examined again to ascertain whether the problem has been corrected. If the problem persists, other corrective actions may be undertaken, and the whole cycle repeats until the problem is remedied.

It has been observed by the inventors herein that the prior art approach suffers from certain inherent disadvantages. For example, the integration of a SPC system on the post-production data log files and post-production substrates is typically a long and difficult process for the IC manufacturers. Once the plasma processing system is delivered, installed, and qualified, the customer/IC manufacturer must process enough sample substrates in order to build up a sufficient reference data to implement the SPC system on the post-production substrates and data log file. Furthermore, since the implementation of a SPC system on the post-production data requires the use of highly trained personnel to implement an appropriate computing environment, to administer the database, to manipulate process recipes to obtain the requisite data, and to integrate the data log file with the SPC system, a tremendous amount of delay and effort is typically necessary to implement the add-on SPC system even though the plasma processing system has already been qualified for production. For customers/IC manufacturers, the burden is highly inconvenient since the aforementioned implementation of a computing environment, administering of a database, and integration of SPC with log file outputs are generally not part the core competencies of the IC manufacturers.

More importantly, since the prior art applies SPC on the post-production data, if there had been a problem while a substrate or a lot or batch of substrates is processed, such problem would not be detected until the next time SPC is applied to the post-production substrates or data. Depending on how often SPC is applied in the prior art, this may result in one, a dozen, or multiple dozens production wafers being ruined before the problem is detected. Since production wafers, the processing gases employed for their processing, and the plasma processing system run time are expensive commodities, the prior art approach leaves a lot to be desired.

Furthermore, even if the prior art applies SPC on a substrate-by-substrate basis after the processing of each substrate is finished, the post-production SPC approach means that at least one substrate would have to go through a defective process cycle and be ruined thereby before the problem would be detected. Since production wafers are expensive, the unnecessary destruction of even one production wafer is still undesirable. Still further, if the problem occurred during one of the earlier steps in the process cycle, such problem would not be detected by the prior art post-production SPC approach until the entire processing cycle is finished. As can be appreciated by those familiar with the semiconductor industry, the long cycle time required in the prior art to detect and remedy a production problem is highly disadvantageous.

Still further, a problem with a given subsystem may cause further damage to other sub-systems if the process is allowed to continue until completion. This is because plasma processing involves highly corrosive gases, often times high density plasma and very high voltages and RF power levels. Accordingly, a failure in one subsystem may have a domino effect on other subsystems if the process is not stopped in time.

In contrast to the prior art approach of applying SPC to post-production substrate or data, FIG. 2A is a simplified diagram showing, in accordance with one aspect of the present invention, the integrated stepwise application of SPC to various steps during the manufacturing, installation, qualification, operation, maintenance, and upgrade processes. In order to improve data granularity, it is recognized by the inventors herein that the stepwise application of SPC should preferably be integrated with the automated control system for the plasma processing system itself. This is in contrast to the prior art approach of applying SPC to the output substrates/data via an add-on SPC system independent of the plasma processing system's automated control mechanism.

As the term is employed herein, statistical analysis or statistical process control (SPC) refers to the analysis of the statistical behavior of a measured parameter or its derivative or a group of measured parameters and to compare such behavior with historical statistical limits. Such statistical analysis or SPC may yield information regarding whether the measured parameter is within an acceptable range or whether a particular subsystem or system exhibits behavior or trends indicative of a particular process state, of failure or other problems.

The integrated stepwise application of SPC relates in one aspect to the recording and statistical analysis, either in real time or near real time and either substantially continuously or periodically with a high degree of granularity, individual parameters of interest during the process of testing a chamber for conformance with predefined specifications or during the processing a test substrate or a production substrate. The recording may be performed using, for example, one or more sensors disposed in the chamber while the statistical analysis may be performed using, for example, appropriate computational circuitry or a computer system.

In the case of testing a chamber for conformance, no substrate may be involved but various subsystems of the plasma processing system may be exercised in certain ways in order to record and statistically analyze relevant parameters using SPC methodologies. In the case of processing a test substrate, a non-production substrate, which may be a blank substrate to reduce cost or a special substrate to facilitate efficient and/or accurate measurements, is processed through the plasma processing system. The contrast is the processing of a production substrate, which involves the use of a production substrate to create a processed substrate suitable for use in producing the finished IC or flat panel products.

The stepwise application of SPC refers to recording and statistical analysis of the parametric data using SPC methodologies substantially in real time or soon after the data is recorded in order to quickly ascertain whether the parameter measured is within allowable tolerances. In contrast to the prior art approach wherein the production data log file is obtained in conjunction with the conclusion of a process cycle and analyzed statistically afterwards, the stepwise application of SPC ensures that the measured parametric data is statistically analyzed during processing and preferably during the same processing step in which the measurement took place in order to improve data granularity and to enable the control system integrated therewith to take action timely to prevent the unnecessary destruction of a substrate or the potential damage to the plasma processing system. In a preferred embodiment, multiple measurements are made for each parameter of interest during each processing step and statistical analysis is preferably performed, in real time or near real time, after each measurement is made.

Integration refers to the embedding or combining of the stepwise SPC system into the automated control mechanism of the plasma processing system. By integrating SPC functionalities into the system's automated control system, it is possible to use the output of the stepwise SPC system to control the operation of the plasma processing chamber (such as to immediately stop the process in the middle of a process cycle if a critical problem is detected with one of the measured parameter). Conversely, it is also possible to manipulate the control system and/or using special recipes in order to improve the efficiency and/or accuracy of data gathering and statistical analysis. Furthermore, the integration of SPC functionalities into the control system relieves the customer/IC manufacturer from the burden of acquiring the expertise in SPC and statistical analysis, of acquiring a separate SPC system, and of integrating the SPC system with the post-production data log file as was required in the prior art.

Referring back to FIG. 2A, the inventive IS-SPC, which is integrated into the control system of the plasma processing system may be applied during the manufacturing process of the plasma processing system. Here, even before striking any plasma or running any process, the subsystems are tested and measurements are made in order to build a baseline database and/or test the various subsystems for conformance with predefined specifications. During testing, sensors measure various statistical elements associated with each measured parameter preferably multiple times during each step of a process. For example, the gas process pressure system may be turned on to measure the average, maximum, minimum, standard deviation, and the like of the various gas pressures. As another example, the helium cooling system may be turned on next to measure the response pertaining to the clamping voltage, the helium flow, the helium pressure, the leakage flow, the wafer temperature during cooling, and the like. As a further example, the RF system may be turned on next to measure the forward RF power, the reflective RF power, the RF match tuning positions, and the like. Of course the order mentioned here is only exemplary and other orders of execution are certainly possible in order to measure the parametric data.

It is important to note that the parametric data is recorded and analyzed statistically in a stepwise manner so that if a statistically significant deviation is detected with any measured parameter during any step, the process may be stopped immediately to remedy the problem found. Since the inventive IS-SPC methodology is integrated with the system's automated control mechanism, the subsystems may be exercised individually in a manner tailored for efficient and/or accurate statistical measurement and analysis, and it is much easier to stop the process, to isolate the source of the problem and to address the problem immediately even before a single substrate is processed and/or possibly wasted.

Once the plasma processing system passes the tests without plasma, the plasma may be struck next to facilitate parametric data measurement and statistical analysis with the plasma turned on. In accordance with one embodiment, one or more test substrates may be processed using one or more test recipes designed to facilitate the efficient and accurate recording and statistical analysis of relevant parameters. Because the inventive IS-SPC is integrated with the system's automated control system, there is no need to limit the processing to the production substrates and production recipes. Thus, the integration advantageously allows system manufacturers to take advantage, in an automated and simplified manner, of special characteristics associated with the test substrates and/or test recipes to probe limits of the plasma processing system under testing.

The parametric data gathered and statistically analyzed may allow the system manufacturer to explore the application of the plasma processing system to other processes rather than to simply test for suitability for the process at hand. This allows the system manufacturer to leverage the development investment in one plasma processing system into multiple markets, for example. Furthermore, a test substrate may be much less expensive than a production substrate. On the other hand, the system manufacturer may also employ a production substrate and a production recipe during the IS-SPC testing period, if desired.

The system manufacturer would typically build a baseline database for the various relevant parameters during manufacturing. This baseline database includes the expected data ranges for acceptable system performance and may be created for either a test substrate/recipe combination or a production substrate/recipe combination. For each data parameters, various expected statistical elements are provided (e.g., average, mean, maximum, minimum, upper warning limit, lower warning limit, and the like). The baseline database may also include expert knowledge information to allow the SPC logic to quickly diagnose a failure. For example, a particular pattern observed in the reflected RF power signal characteristic of a failed RF power supply may be recorded during the manufacturing process and provided in the baseline database to allow the SPC logic to quickly diagnose during production that a RF power supply has failed.

The baseline database may be employed during the installation process to make sure that the installation is correct, and in the subsequent qualification, production, maintenance, and upgrade processes. Generally speaking, the control-integrated IS-SPC logic or algorithms, the test substrates, the specific recipes that accompany the test substrates, and/or the baseline database for the test substrate/recipe combination or for the production substrate/recipe combination may be furnished by the system manufacturer as a package for use during the subsequent installation, qualification, production, maintenance, and upgrade processes.

During installation, IS-SPC is again applied as shown in FIG. 2A. During the installation process, the parametric data is again measured and statistically analyzed, in a stepwise manner, using the baseline database for the test substrate/recipe combination or the baseline database for the production substrate/recipe combination, to ensure that the installation process is correct. Since the parameters are individually measured and statistically analyzed against the supplied baseline database substantially in real time or shortly after being recorded in a stepwise manner and as each subsystem is exercised, the engineers performing the installation can quickly detect a problem and isolate the source of any problem found.

In many cases, an installation error can be detected and remedied without wasting a single substrate (such as the case when the problem is detected before the introduction of a substrate into the chamber or before plasma ignition). Problems detected and the symptoms therefor can also be added to the database to build up the knowledge base regarding possible problems encountered during installation. This information may be leveraged by the manufacturer in order to, for example, redesign certain subsystems in order to minimize certain installation errors in the future.

Figure 2B:
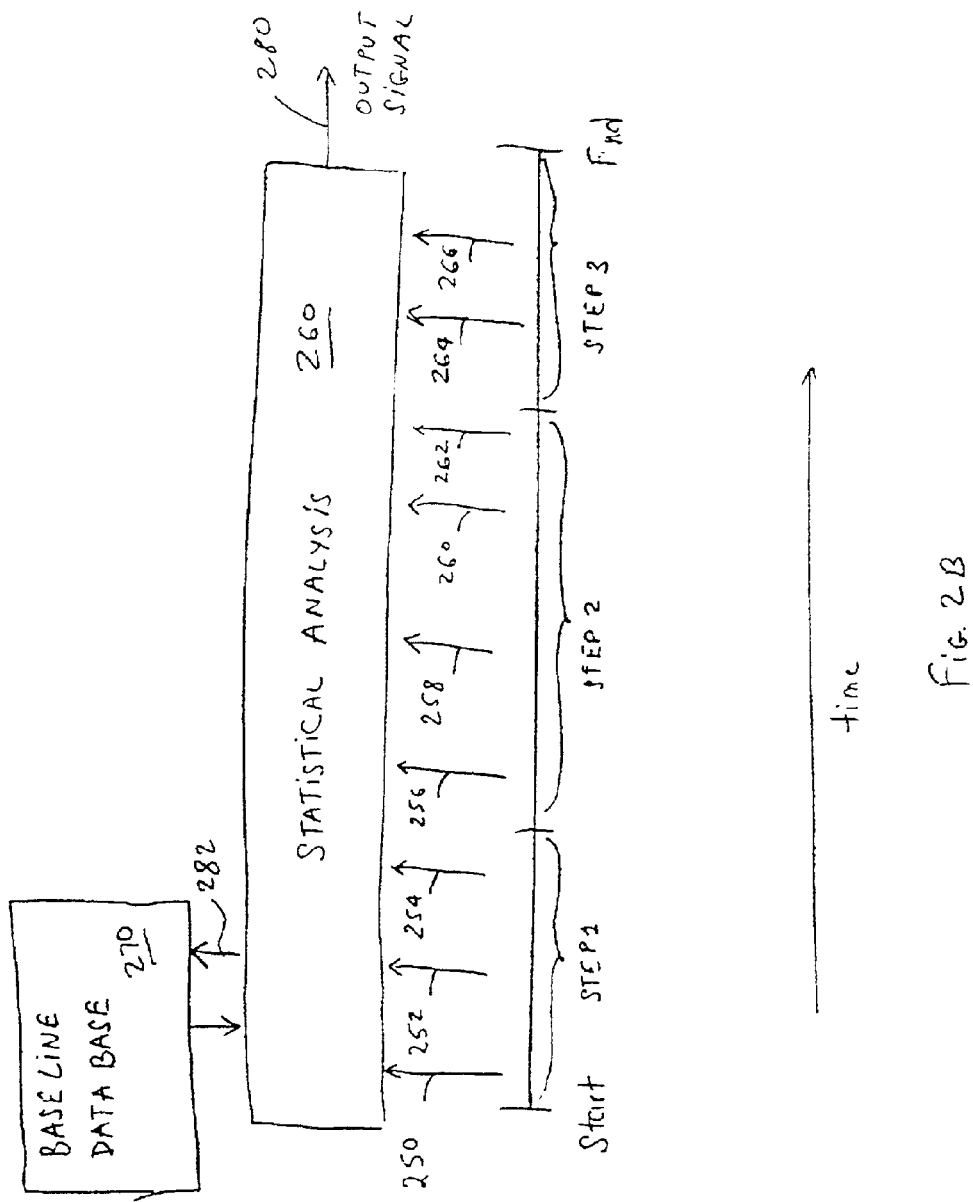
FIG. 2B is a simplified diagram showing, in accordance with one aspect of the present invention, the integrated stepwise application of SPC to various steps of a production run.

During each production run, IS-SPC is again applied. Again, the parametric data is measured individually and statistically analyzed substantially in real time or shortly after being recorded in a stepwise manner against the supplied baseline database. With reference to FIG. 2B, there is shown an exemplary process having three steps: step 1, step 2, and step 3. A plurality of measurements pertaining to a particular parameter may be made at times 250–266 as shown. These measurements are input into a statistical analysis module 260, which employs a reference baseline database 270 to ascertain in substantially in real time or shortly after the measurements are made whether the measured parameter falls within an acceptable range. Of course, in the typical case, multiple parameters would be measured at various times during steps 1–3 of the process. The statistical analysis results in a signal 280, which may be input into the automated control mechanism of the plasma processing system and/or the user interface module to apprise the user of status.

Because the IS-SPC logic and the baseline database are supplied by the system manufacturer, the amount of effort required on the part of the customer/IC manufacturer to implement SPC is vastly minimized. Further, because the invention integrates the statistical analysis system with the control system for the plasma processing system, if a statistically significant deviation is detected in any measured parameter during any step of the production process, the process may be stopped before wasting any additional time proceeding with an already defective process or before further damage may occur to other subsystems of the plasma processing system.

In the case when the problem is detected before the process gases are released and/or before the plasma is ignited, the production substrate may be saved. If a problem is detected with a measured parameter during a particular step, since the parameters are individually measured in a stepwise manner and statistically analyzed against the supplied database substantially in real time or shortly after being recorded, the process engineer can quickly pinpoint the particular parameter of concern, the particular subsystem associated with such parameter, and the particular step or even the sub-step of a particular process step when the parameter value begins to deviate from the expected range. This information can vastly speed up the repair process to allow the plasma processing system to be brought back into production quickly.

During production, the recorded parametric data (which may include many statistical elements associated with each measured parameter such as maximum, minimum, average, standard deviation, and the like) or the derivative or analysis thereof may also be added to the database to allow system manufacturers to more clearly understand the degradation trend associated with a given subsystem. This is symbolically shown in FIG. 2B via arrow 282. This information allows the system manufacturer to optimize the maintenance cycle over time so that the right subsystem may be maintained and/or replaced at the appropriate time to minimize breakdowns as well as to avoid performing unnecessary maintenance, which unnecessarily interrupts the production schedule. This information may also be leveraged by the system manufacturer to redesign certain subsystems if the degradation trends indicate that certain subsystems are consistently wearing out prematurely.

Referring back to FIG. 2A, IS-SPC may also be applied during the scheduled maintenance times to detect whether other subsystems which may not be scheduled for replacement and/or maintenance may need to be addressed. By using the supplied baseline database for the test substrate/recipe combination or the production substrate/recipe combination, and by measuring and statistically analyzing the parametric data in a stepwise manner, the maintenance engineer can quickly spot problems and apply any necessary maintenance.

Since the test substrate/recipe combination and the baseline database therefor may yield information different from those obtained from IS-SPC during production, the maintenance-time application of IS-SPC, particularly the maintenance-time application of IS-SPC using the test substrate/recipe combination, is particularly advantageous. In many cases, these problems may be detected and/or addressed without wasting a single test or production substrate (e.g., if the problem is detected in connection with a step prior to process gas release or plasma ignition). The parametric data measured during maintenance, using either the test substrate/recipe or the production substrate/recipe, may also be added to the database in order to improve understanding of the degradation trends and to optimize future maintenance cycles.

A system manufacturer may perform an upgrade to a reference plasma processing system in the factory and run IS-SPC thereon to obtain an updated baseline database for the upgrade. Once the system manufacturer is satisfied with the upgrade, it can furnish the upgrade hardware and/or software and/or recipe, along with the updated baseline database (and optionally any updated test substrate/recipe) to their customers to facilitate a quick and efficient upgrade in the field. The upgrade hardware and/or software may be installed on the customer's system and/or the upgraded test or production substrate/recipe may be executed in the customer's system, and IS-SPC may be applied to quickly spot and isolate any problem for engineers to remedy.

With IS-SPC, an upgrade error can be detected and remedied without wasting a single substrate (such as the case when the problem is detected before the introduction of the substrate into the chamber or before plasma ignition). Further, since the manufacturer supplies the updated baseline database and any updated test substrate/recipe, the amount of time and effort required of the customer/IC manufacturer to update the SPC system, as well as any concomitant interruption to production, is minimal. This is in contrast to the prior art situation wherein even if the upgrade is correctly performed, the customer/IC manufacturer is still forced to invest a substantial amount of time and effort to upgrade the add-on SPC system to correctly perform statistical analysis on the post-production data log file associated with the upgrade.

It should be noted that the present invention places no limitation on the type of parameter that can be measured, the frequency with which measurements can be made, or the specific steps in which measurements can be made. As is well known, different types of probes or measurement arrangements may be provided with different implementations of a plasma processing system to measure different parameters. These probes or measurement arrangements are readily available commercially and their information may be found in the literature. Examples of measurable parameters include various pressure-related or volume-related or flow-related parameters (such as the helium gas pressure, various process gas pressures, the helium flow, the flow of each process gas), various AC, DC, and/or RF-related parameters (e.g., voltage, current, power, and the like), various temperature-related parameters (e.g., chuck temperature, plasma temperature, substrate temperature, and the like), various plasma-related parameters (e.g., various optical emission measurements, ion densities, and the like). Each of these parameters may be measured with a single measurement device or by multiple devices distributed at various location in the plasma processing system.

With regard to the frequency of data measurement, a higher frequency generally affords a more detailed picture of the measured parameter, albeit at the expense of higher data storage and processing requirements. However, data storage and computing power is inexpensive and improving everyday and for some systems, it may be possible to measure a parameter every few minutes, every minute, every second, every microsecond, every nanosecond, or even every picosecond, and any time in between depending on how much computing power one is willing to pay for and the capability of the measuring instrument. With regard to the step or steps in which one or more measurements can be made, one or more measurements may be made before, during, and after each subsystem is activated, for example before, during, and after substrate introduction and removal, before, during, and after process gas release, before, during, and after turning on RF power, before, during, and after plasma ignition, and the like.

Figure 3:
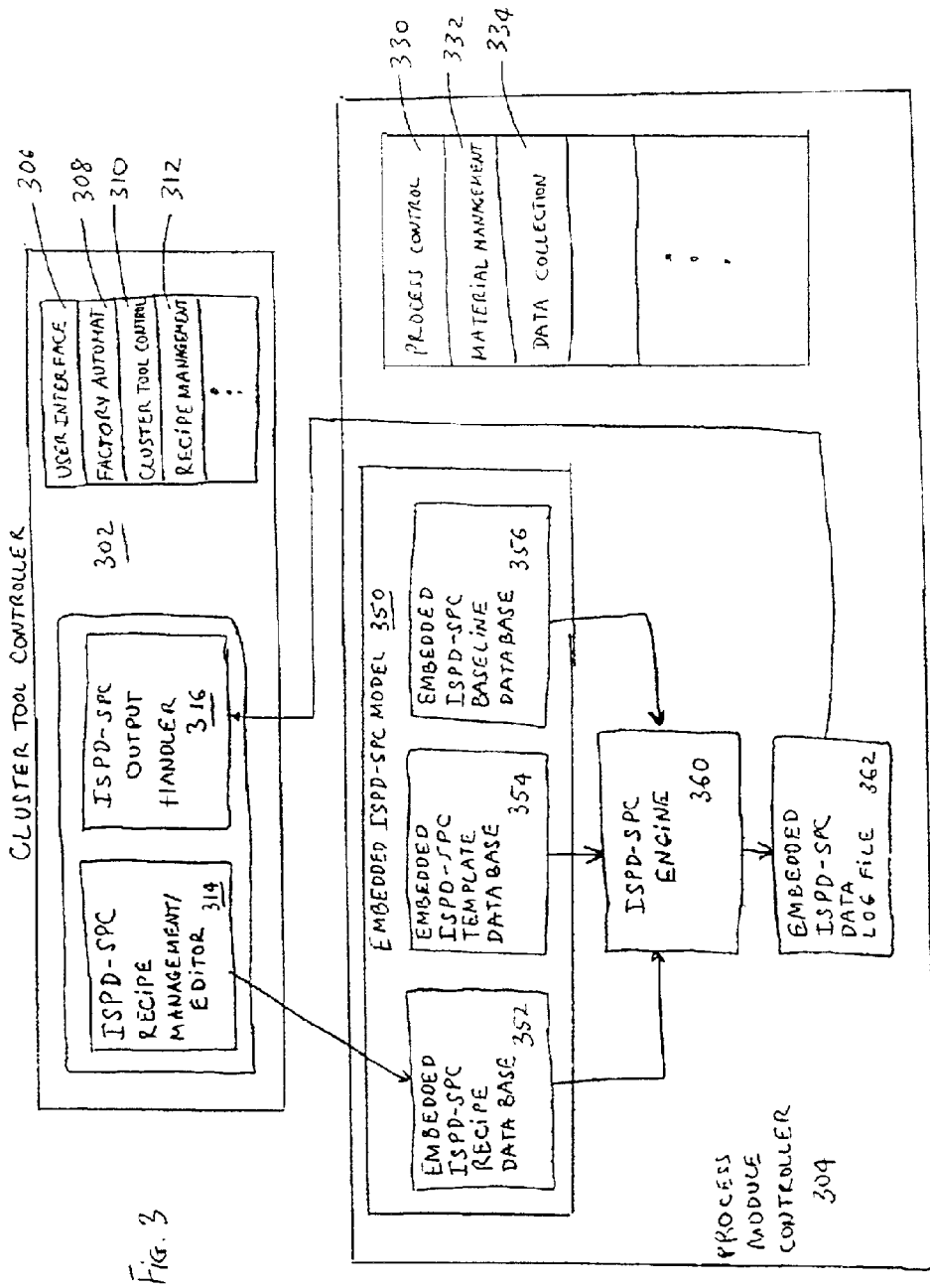
FIG. 3 shows, in accordance with one aspect of the present invention, a logic diagram for an improved automated control system (ACS) that is integrated with the inventive IS-SPC methodology

FIG. 3 shows, in accordance with one aspect of the present invention, a logic diagram for an improved automated control system (ACS) that is integrated with the inventive IS-SPC methodology. With reference to FIG. 3, the integrated IS-SPC/ACS system 300 includes two main modules: a cluster tool controller 302 and a process module controller 304. Cluster tool controller 302 includes most of the user interface components, while process module controller 304 includes the logic for performing IS-SPC, as well as circuitry for performing automated process control.

Cluster tool controller 302 may include such familiar cluster tool control modules as the user interface module 306 for permitting a human operator to interact with the plasma processing system. Cluster tool controller 302 may also include a factory automation module 308 for performing process scheduling, process sequencing, and the like. There may also be included a cluster control module 310 for controlling the routing of substrates among the various chambers of the cluster of chambers that make up the plasma processing system. Cluster tool controller 302 may also include a recipe management module 312 for managing the production recipes. Modules 306–312 and other cluster tool control modules are well known in the art and will not be described in detailed here for brevity sake. Additional information pertaining to these modules may be found in, for example the 2300 Transport Module Operations Manual, available from Lam Research Corporation of Fremont, Calif. and incorporated herein by reference.

In addition to the aforementioned known front-end modules, cluster tool controller 302 may also include, in accordance with one aspect of the invention, an embedded IS-SPC recipe management editor 314, which allows the human operator to input and edit the recipes employed for IS-SPC. IS-SPC recipe management/editor 314 allows a customer/IC manufacturer to customize a particular process recipe specifically for IS-SPC purposes, such as to facilitate the measurement of parameters to monitor tool degradation. IS-SPC recipe management/editor 314 also performs recipe management functions, such as recipe version control, recipe release control, and the like. In this manner, the recipes edited and/or used for IS-SPC purposes can be readily tracked should there be a need to associate the logged measurement data with the specific recipe(s) employed to generate such measurement data.

Cluster tool controller 302 may further include, in accordance with one aspect of the invention, an embedded IS-SPC output handler 316, which is configured to interface with the user and/or other systems based on the data output by the IS-SPC engine. IS-SPC output handler 316 and IS-SPC recipe management/editor 314 may be thought of as the primary components of the front-end portion of the IS-SPC system. IS-SPC output handler 316 will be further discussed later herein.

Process module controller 304 includes such familiar back-end modules as those typically employed for real-time process control. Thus, there may be included a process control module 330 for controlling and monitoring the process environment based on specified recipe parameters, a data management module 332 for managing and tracking the substrate through the execution lifetime, a data collection module 334 for collecting data pertaining to the process run. Modules 330–334 and other backend modules are well known in the art and will not be described in detailed here for brevity sake. Additional information pertaining to these modules and others may be found in, for example, the 2300 Versys™ Process Module Operation Manual, also available from the aforementioned Lam Research Corporation of Fremont, Calif. and incorporated by reference herein.

In addition to the aforementioned known back-end modules, process module controller 304 may also include, in accordance with one aspect of the invention, an embedded IS-SPC model 350, which includes an embedded IS-SPC recipe database 352. Embedded IS-SPC recipe database 352 represents the database of recipes, both manufacturer-supplied and those created/edited by the customer/IC manufacturer, for use in IS-SPC. To assist in the execution of these recipes, there is also provided, in accordance with one aspect of the invention, an embedded IS-SPC control template database 354. The templates embody SPC strategies for the recipes, and a given template may be applied to a number of recipes to facilitate the execution thereof.

Process module controller 304 further includes, in accordance with one aspect of the invention, an embedded IS-SPC baseline database 356. Generally speaking, the embedded IS-SPC baseline database 356 may include many statistical elements associated with the measured parameters and represents the expectations pertaining to the measured parameters when a particular IS-SPC process employing a particular IS-SPC recipe is executed. The embedded IS-SPC baseline database is generally, but not necessarily, supplied by the system manufacturer and may be supplemented from time to time by data gathered during use from one or more plasma processing systems.

An IS-SPC engine 360 may execute a given recipe and associated template selected from embedded IS-SPC recipe database 352 and embedded IS-SPC control template database 354 to generate measurement data and to facilitate statistical analysis. IS-SPC engine 360 further contains the statistical analysis logic or algorithms to statistically analyze the measured data against data in embedded IS-SPC baseline database 356. The measurement data is logged in an embedded IS-SPC data log file 362, which can be analyzed subsequently to pinpoint the source of a failure, to further understanding of the degradation trends of various subsystems of the plasma processing system, to facilitate optimizing the maintenance schedule, and the like.

During execution of either a production recipe on a production substrate or a recipe tailored for IS-SPC purposes on a non-production substrate, the statistical analysis occurs on the measurement data substantially in real time or soon after the data measurement takes place. The result of the analysis may be fed into IS-SPC output handler 316 in the front-end cluster tool controller 302 in order to apprise the human operator of the status, to alert the human operator of any error condition, or to stop the processing altogether.

Figure 4C:
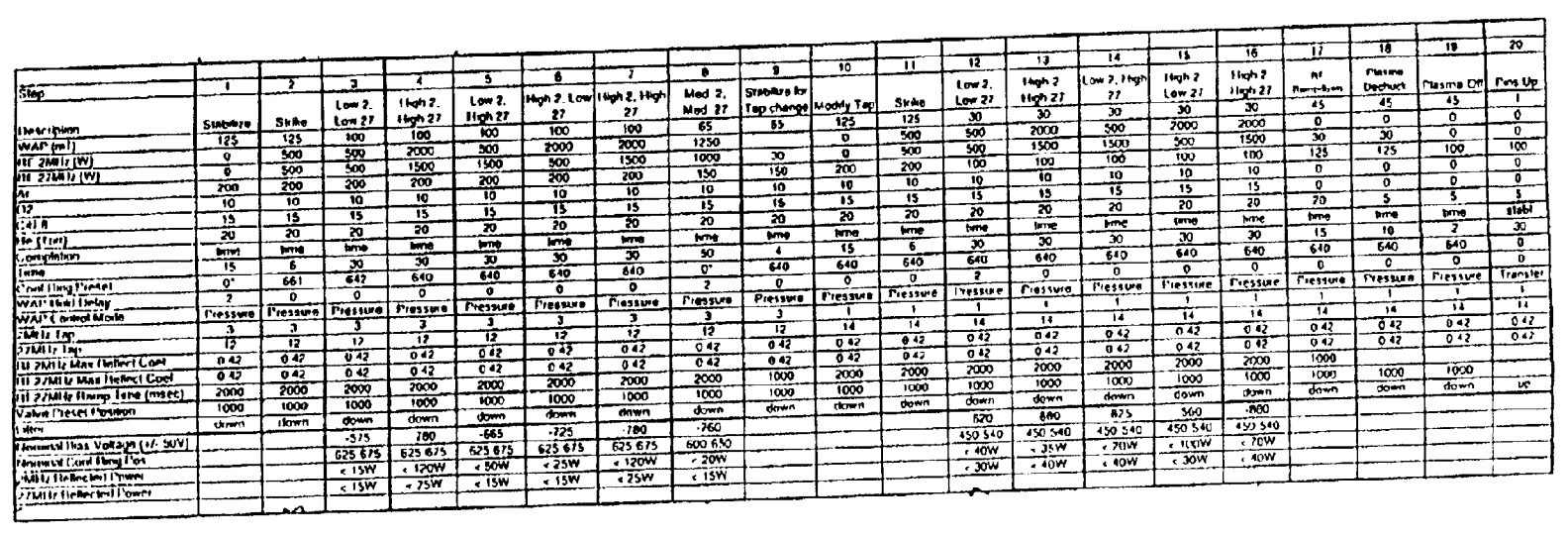

FIGS. 4A–4C show three different matrices showing three exemplary test recipes furnished for IS-SPC use, along with the expected values. These matrices may, for example, be furnished by the system manufacturer as part of the baseline database for IS-SPC use during manufacturing, installation, qualification, production, maintenance, and upgrade. In FIG. 4A, the recipe and expected responses for testing the pressure control system are furnished. Note that in FIG. 4A, a wafer is not required for testing the pressure control system in a six-step process. The set points for various parameters and the expected average pressure response, as indicated by the nominal confinement ring position and the wafer area pressure (WAP) are shown. Of course, the baseline database furnished may also include other statistical elements associated with those expected parameters (e.g., average, mean, maximum, minimum, upper warning limit, lower warning limit, and the like).

In FIG. 4B, the recipe and expected responses for testing the helium cooling control system are furnished. Note that in FIG. 4B, a wafer is present but plasma ignition is not required for testing the helium cooling system in a two-step process. The set points for various parameters and the expected average pressure response, as indicated by the nominal He flow and the nominal He pressure are shown. Of course, the baseline database furnished may also include other statistical elements associated with those expected parameters (e.g., average, mean, maximum, minimum, upper warning limit, lower warning limit, and the like).

In FIG. 4C, the recipe and expected responses for testing the RF voltages and power, as well as the chamber pressure are furnished. In contrast to FIG. 4A and FIG. 4B, a wafer is present and the plasma is ignited during the test of FIG. 4C. The set points for various parameters and the expected average responses, as indicated by the nominal bias voltage, the nominal confinement ring position, the 2 MHz reflected power and the 27 MHz reflected power are shown. Of course, the baseline database furnished may also include other statistical elements associated with those expected parameters (e.g., average, mean, maximum, minimum, upper warning limit, lower warning limit, and the like).

Figure 5:
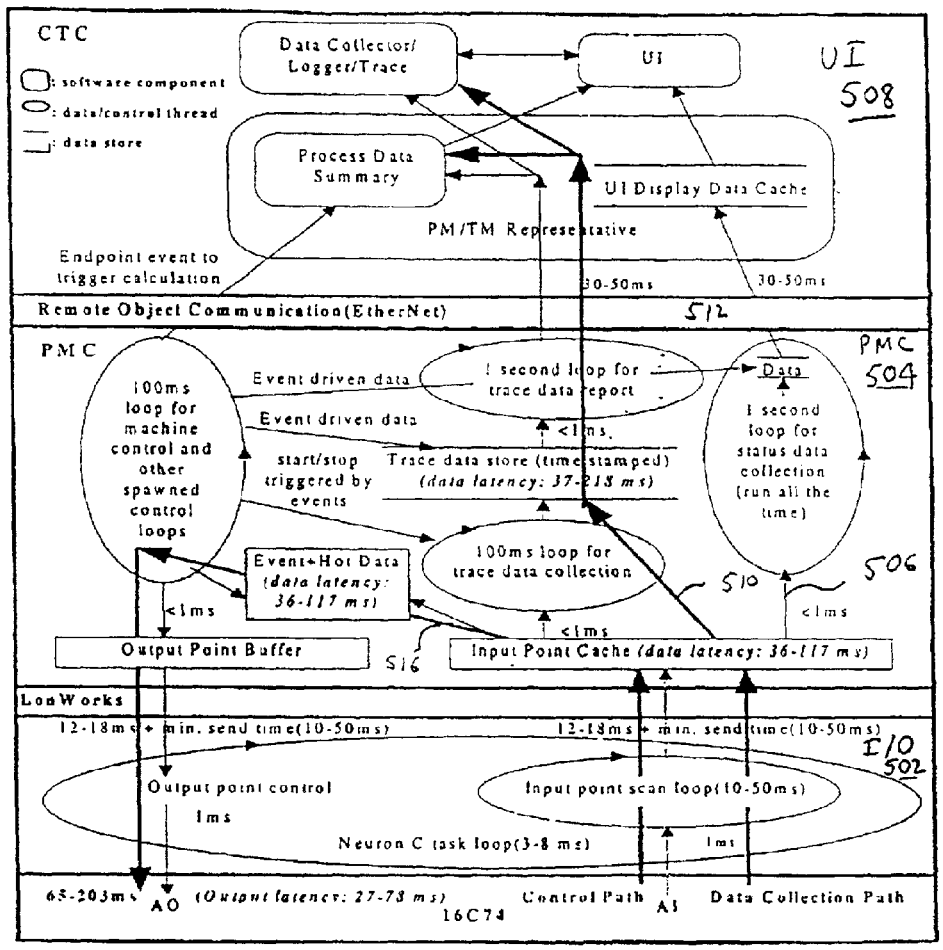
FIG. 5 illustrates, in accordance with one embodiment of the present invention, how data collection may be performed in a plasma processing system that employs IS-SPC.

FIG. 5 illustrates, in accordance with one embodiment of the present invention, how data collection may be performed in a plasma processing system that employs IS-SPC. The challenges with data collection and analysis for use in stepwise SPC include the management of a vast amount of data from different sensors and different actuators and other data sources such as mathematical functions that operate on the raw data, and the need to sample data in a manner so as to achieve the required data granularity, for status display, for SPC use, and for feedback control without overwhelming the processing logic. Another challenge relates to the need to transmit data from the sensors, actuators, and other data sources to the SPC engine in a timely manner for analysis despite communication channels that may experience indeterminate congestion and/or latency from time-to-time.

In a preferred implementation, the sensors and/or actuators are grouped into various groups according to, for example, functionality, similarity in sampling requirements, or locality. Each group of sensors and/or actuators is preferably coupled to an I/O module controller 502. Thus, a plasma processing system may have multiple I/O module controllers 502 distributed throughout the system. Each I/O module controller 502 performs local data collection from the sensors and/or actuators coupled to it and outputs data to the actuators coupled to it. For example, a given I/O module controller 502 may scan all sensors and/or actuators connected to it as fast as every 5 ms. The time between scans may be determined by the number of sensors and/or actuators involved and the computing power of the given I/O module controller 502 and the requirement of real-time control.

I/O module controller 502 is configured to report to a process module controller (PMC) 504 collected data, preferably only collected data that has been changed since the last scan. There are at least two ways to communicate between I/O module controller 502 and PMC 504. For time-critical data, I/O module controller 502 may be coupled to PMC 504 via a local bus technology, such as VME, and may upload the data directly to PMC 504 memory via a direct memory access (DMA) technique. Using a direct connection I/O, the latency can be kept low, in the microseconds range or lower.

I/O module controller 502 may also be coupled to PMC 504 via a network connection, such as one employing the LonWorks (LON) technology by Echelon Corporation of San Jose, Calif. LonWorks technology is preferred because the delay and latency characteristics associated therewith is more deterministic than a packet network technology, such as Ethernet. Other networking connection technologies having the requisite latency/delay characteristics may also be employed. A network connection may be preferable due to the remote nature of a given I/O module controller or other cabling-related issues, for example.

To further modulate the amount of data transferred between the various I/O module controllers and the PMC, the PMC software may also specify, for data from some sensors and/or actuators, that it is only interested in receiving data that has remained changed for longer than a given period of time, or data for which the magnitude of the change is greater than a specified threshold.

The data received by PMC 504 is then processed along at least two different paths. For the status data path 506, an independently executing thread obtains all sensor and/or actuator data from the various I/O module controllers to be passed along to user interface module 508 for display. Since status data is employed for display purposes, this status data executing thread has a lower priority in PMC 504, and data collection (either via polling or event-driven) proceeds at the rate suitable for display, e.g., every 1 second.

For the trace data path 510, the trace data is collected through another independently executed thread and employed for SPC purposes. Accordingly, a faster data collection rate is preferred (e.g., 100 ms or faster vs. 1 second as in the case of status data). The data collection rate may, however, be configured as desired. Furthermore, the execution thread for collecting the trace data may have a higher priority in PMC 504 than the execution thread for the status data. In one embodiment, the execution thread for collecting the trace data may have a higher priority even than the control thread that controls the actuators (which is also shown in FIG. 5).

However, a fast trace data collection rate may result in a large processing load for PMC 504. Accordingly, the operator may filter the data, in accordance with one aspect of the present invention, by specifying that only data from certain sensors and/or actuators and/or other data sources are to be collected for SPC purposes. Further, the user may also specify that data from different sensors and/or actuators and/or other data sources are collected at different rates or handled differently, and/or data from certain sensors and/or actuators and/or other data sources are collected only if the magnitude of the change exceeds a given threshold or the duration of the change exceeds a certain time period. Again, data collection may be achieved via polling or the data collection may be event-driven.

Most importantly, each piece of data collected for SPC purposes along trace data path 510 is time-stamped to reflect their relative time. Time stamping allows the trace data to be accurately reconstructed when the trace data is received by UI 508 for step-wise SPC purposes. Thus, even if the communication channel between PMC 504 and UI 508 (shown by Ethernet connection 512) experiences congestion or delay, the time stamp associated with each piece of data allows the data to be reconstructed accurately with respect to the relative time between various pieces of data. For SPC purposes, it is the relative time between the various pieces of data that is of utmost important, particularly as process geometries decrease.

Once the data is time-stamped, the integrity of the data is preserved, and the time-stamped trace data may then be reported to UI 508 at any rate suitable rate for SPC purposes. In one example, the time-stamped trace data is reported to UI 508 every 1 second.

PMC 504 may also employ the collected data for control purposes. Thus, there is shown a control data path 516, which may be collected independent of trace data collection and status data collection. The frequency of data collection for control purposes depends on many variables, including whether it is important to respond quickly when sensor data associated with a given sensor changes.

Since the invention separates the data collection and processing within PMC 504 along different functional paths, the data collection and processing rates associated with these different functional paths can be regulated to satisfy the different needs of the different functions without overwhelming the processing capacity of the PMC. For status display, a lower priority executing thread and a relatively low data collection rate ensure that PMC 504 is not overwhelmed. For SPC purposes, the executing thread has a higher priority and the data collection rate is also faster, but the data may be filtered by the operator. Accordingly, the trace data for SPC purposes is collected with a higher resolution and lower latency, but in a manner so as not to overwhelm the PMC 504.

Time-stamping the trace data allows the relative time information to be preserved even if the communication path between PMC 504 and the SPC engine has an indeterminate latency and/or delay. Accordingly, the invention allows inexpensive and widely available packet networking equipment (such as Ethernet equipment) to be used despite the indeterminate latency and/or delay nature of such packet-based networking. By using accurately reconstructed trace data instead of the status data for SPC purposes, the invention facilitates highly accurate SPC processing, which is important as process geometries shrink.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for manufacturing a plasma processing system having a chamber, said chamber being configured for processing a substrate, comprising:

providing a first sensor within said chamber, said first sensor being configured for monitoring a first parameter within said chamber during a testing step and for outputting first data, said testing step being part of a manufacturing process of said plasma processing system and being performed without striking a plasma within said chamber; and providing logic for analyzing said first data obtained from said sensor, said analyzing including performing a stepwise statistical analysis of said first data during said testing step in view of a reference baseline database;

if said first data indicates a fault during said testing step, outputting a first signal responsive to said analyzing to enable a control module of said plasma processing system to terminate said testing step earlier than a scheduled termination time, said scheduled termination time representing a termination time that would have occurred if said first data had indicated no fault.

2. The method of claim 1 wherein said first parameter measures a flow rate of a process gas into said chamber.

3. The method of claim 1 wherein said first parameter measures a flow rate of helium cooling gas.

4. The method of claim 1 wherein said first parameter measures a pressure within said chamber.

5. The method of claim 1 wherein said first parameter measures a voltage associated with a structure disposed at least partially within said chamber.

6. The method of claim 1 wherein said first parameter measures a temperature associated with a structure disposed at least partially within said chamber.

7. A method for manufacturing a plasma processing system having a chamber, said chamber being configured for processing a substrate, comprising:

providing a plurality of sensors within said chamber, said plurality of sensors being configured for monitoring at least a first parameter and a second parameter within said chamber during a testing step and for outputting first data, said testing step being part of a manufacturing process of said plasma processing system and being performed without striking a plasma within said chamber;

providing logic for analyzing said first data and second data obtained from said plurality of sensors, said first data pertaining to said first parameter, said second data pertaining to said second parameter, said analyzing including performing a stepwise statistical analysis of said first data and said second data during said testing step in view of a reference baseline database; and if said analyzing indicates a fault during said testing step, outputting a first signal responsive to said analyzing to enable a control module of said plasma processing system to terminate said testing step earlier than a scheduled termination time, said scheduled termination time representing a termination time that would have occurred if said first data and said second data had indicated no fault.

8. The method of claim 7 wherein said first parameter measures a flow rate of a process gas into said chamber.

9. The method of claim 7 wherein said first parameter measures a flow rate of helium cooling gas.

10. The method of claim 7 wherein said first parameter measures a pressure within said chamber.

11. The method of claim 7 wherein said first parameter measures a voltage associated with a structure disposed at least partially within said chamber.

12. The method of claim 7 wherein said first parameter measures a temperature associated with a structure disposed at least partially within said chamber.

13. The method of claim 7 wherein said first parameter measures one of a set of parameters, said second parameter measures another of said set of parameters, said set of parameters consisting of a flow rate of a process gas into said chamber, a flow rate of helium cooling gas, a pressure within said chamber, a voltage associated with a structure disposed at least partially within said chamber, and a temperature associated with a structure disposed at least partially within said chamber.

14. A method for preparing a plasma processing system for processing substrates, said plasma processing system having a chamber, comprising:

providing a plurality of sensors within said chamber, said plurality of sensors being configured for monitoring at least a first parameter and a second parameter within said chamber during a testing step and for outputting first data, said testing step being performed without striking a plasma within said chamber and representing a part of one of an installation process and a qualification process;

providing logic for analyzing said first data and second data obtained from said plurality of sensors, said first data pertaining to said first parameter, said second data pertaining to said second parameter, said analyzing including performing a stepwise statistical analysis of said first data and said second data during said testing step in view of a reference baseline database provided by a manufacturer of said plasma processing system; and if said analyzing indicates a fault during said testing step, outputting a first signal responsive to said analyzing to enable a control module of said plasma processing system to terminate said testing step earlier than a scheduled termination time, said scheduled termination time representing a termination time that would have occurred if said first data and said second data had indicated no fault.

15. The method of claim 14 wherein said first parameter measures a flow rate of a process gas into said chamber.

16. The method of claim 14 wherein said first parameter measures a flow rate of helium cooling gas.

17. The method of claim 14 wherein said first parameter measures a pressure within said chamber.

18. The method of claim 14 wherein said first parameter measures a voltage associated with a structure disposed at least partially within said chamber.

19. The method of claim 14 wherein said first parameter measures a temperature associated with a structure disposed at least partially within said chamber.

20. The method of claim 14 wherein said first parameter measures one of a set of parameters, said second parameter measures another of said set of parameters, said set of parameters consisting of a flow rate of a process gas into said chamber, a flow rate of helium cooling gas, a pressure within said chamber, a voltage associated with a structure disposed at least partially within said chamber, and a temperature associated with a structure disposed at least partially within said chamber.

* * * * *